United States Patent [19]

Liger et al.

[11] Patent Number: 5,459,434
[45] Date of Patent: Oct. 17, 1995

[54] DETECTOR AMPLIFIER FOR STANDBY SYSTEM

[76] Inventors: René Liger, 103, route des Vignes, F 78270 Limetz-Villetz; Pierre Rochon, 70, rue de la Tour, F-75016 Paris, both of France

[21] Appl. No.: 286,964

[22] Filed: Aug. 8, 1994

[30] Foreign Application Priority Data

Aug. 11, 1993 [FR] France ................................. 93 09854

[51] Int. Cl.$^6$ .................................. H03F 3/04; H03D 1/00
[52] U.S. Cl. .......................... 330/147; 330/311; 329/369
[58] Field of Search ............................. 330/74, 147, 297, 330/310, 311; 329/347, 368, 369

[56] References Cited

U.S. PATENT DOCUMENTS 3,152,309 10/1964 Boqusz et al. .
3,177,437 4/1965 Wood ..................... 330/74 X
3,177,439 4/1965 Tulp et al. ................ 330/74 X
4,590,436 5/1986 Butler et al. .
5,041,797 8/1991 Belcher et al. .

FOREIGN PATENT DOCUMENTS 7625251 3/1977 France .
2734945 2/1979 Germany .

Primary Examiner—James B. Mullins
Attorney, Agent, or Firm—Spencer, Frank & Schneider

[57] ABSTRACT

A detector amplifier includes a first stage, a second stage and a low voltage supply. The first stage has a first input for receiving a first input signal, and an output for outputting a first output signal, and amplifies and/or demodulates the first input signal to form the first output signal. The second stage is coupled in series to the first stage and has a first input for receiving the first output signal, a second input for receiving a second input signal, and an output for outputting a second output signal. The second stage amplifies and/or demodulates the first output signal and the second input signal to form the second output signal. The low-voltage supply is coupled in series with the first and the second stage for supplying a DC current to the stages.

10 Claims, 2 Drawing Sheets

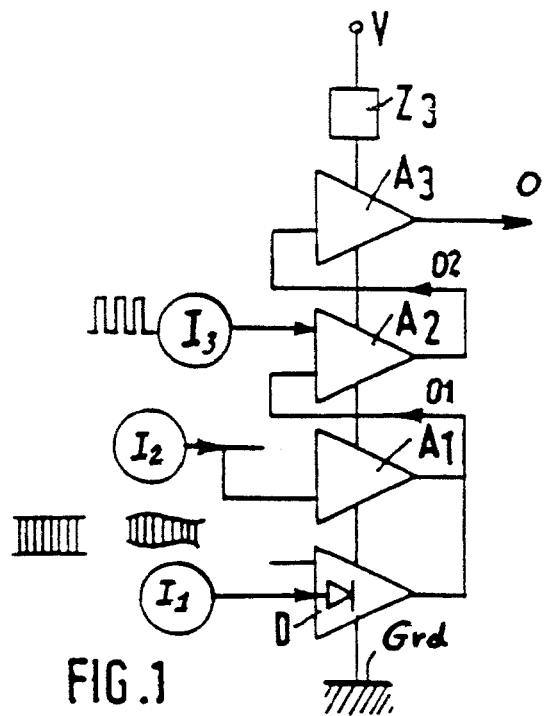
FIG. 1
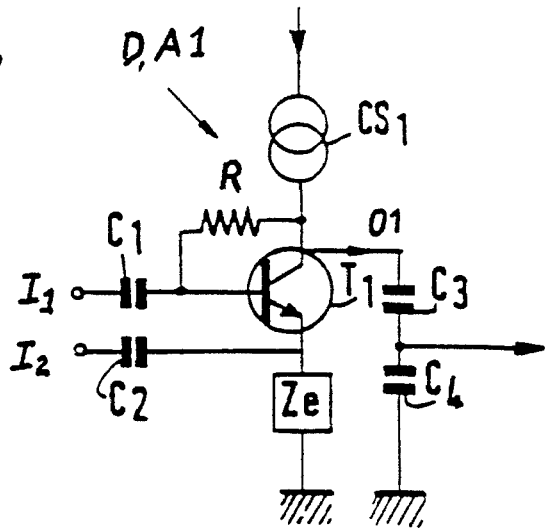
FIG. 2
FIG. 3
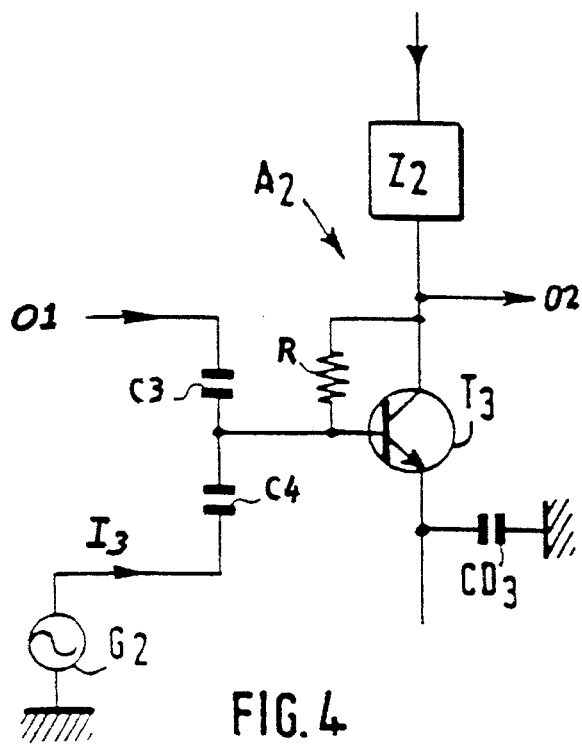
FIG. 4
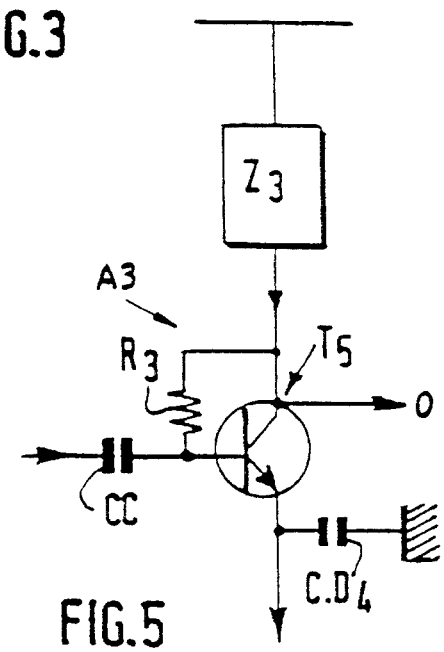
FIG. 5

DETECTOR AMPLIFIER FOR STANDBY SYSTEM

BACKGROUND OF THE INVENTION

1. Field of the Invention

The subject of the present invention is an amplifier for standby system, operating permanently and able to be "woken up" by electronic signals of origin external to the amplifier, for example: alternating or continuous magnetic field, modulated or unmodulated electromagnetic field, modulated or continuous infrared field, etc.

2. Description of the Related Art

When the amplifier uses a battery for supply, it is necessary periodically to change the latter. Now, in certain devices, the battery cannot be replaced, or not without great difficulty. It is therefore necessary, in this case, to provide an amplifier of high gain, but of the lowest possible consumption. Such devices are used in antitheft devices for automobiles, electronic transaction devices for urban or cross-country automobile traffic toll facilities, pedestrian access control; "hands-free" toll devices in public or private means of transport.

A device of this type generally requires the detection of several signals of different kinds, in particular:

frequency or amplitude modulated high-frequency HF signals;

infrared signals; and mechanical signals after passing through a transducer.

These signals are in general low level. Their processing therefore requires high-gain amplification, this in general necessitating a large current. It is therefore essential to minimize the consumption of an amplifier on permanent standby, if it is desired that it operate for as long as possible given the capacity of the supply battery.

Such an amplifier must be able to amplify signals of different types which may exhibit different impedances. The conventional solution consists in providing an amplifier for each input, the outputs of the amps being linked to an active or passive summing unit which processes the signals in order to deliver a correct output signal on the single output of the amplifier. However, given that in such a device each stage is individually linked to the supply, this requires the use of a battery of high capacity, and hence large volume, since the consumption is multiplied by the number of stages.

Taking a battery with a capacity of 100 mAh, it can yield a maximum current of 3.80 µA for three years, namely substantially 26,300 hours. If, now, the amplifier consumes a current i=3 µA, and if it is "woken up" 24 times per day in order to carry out an electronic transaction during which it requires an instantaneous consumption of 3 mA for 100 ms, the mean current, to carry out these transactions, is then determined to be: I mean=3×0.1/3600=0.08 µA.

From these two examples it is possible to deduce that:

the current consumed in order to carry out electronic transactions is negligible and would lead to a theoretical lifetime of around 142 years for a battery with a capacity of 100 mAh;

the lifetime of the battery is, in practice, constrained solely by two elements, namely: its leakage current and the value of the current consumed permanently by the amplifier which it supplies.

For modern lithium batteries, the manufacturers frequently indicate a lifetime of five to ten years, which, in the case of a capacity of 100 mAh, corresponds to a leakage current of between 1.15 µA and 2.3 µA. Thus, for a battery with a capacity of 100 mAh and three years of consumption, by assuming that the leakage current is just 1.5 µA, the permanent current available to activate the standby device is just 2.3 µA.

To try to limit the consumption of an amplification circuit, those skilled in the art have proposed placing the amplification and power supply stages in series.

The German Patent DE-A 27 34945 (R. BOSCH) and American Patent US-A 5 041 797 (D. K. BELCHER) describe such amplifiers.

These comprise:

a first stage furnished with a first input able to receive a first signal, and with an output for delivering said first signal after amplification and/or demodulation, at least one second stage linked in series to the first stage and furnished with a first input able to receive the signal from the output of the first stage, and with an output for delivering the signal after amplification and/or demodulation, and a low-voltage supply linked in series with the stages, and capable of supplying the stages with DC current.

The major drawback of this type of amplifier lies in the fact that it is able merely to amplify a single signal from the input of a first stage. Stage (n) serves merely to amplify the signal delivered by stage (n−1) directly preceding it.

If it is wished to process several different signals, several amplifiers of this type must therefore be juxtaposed, this again requiring several power supplies.

SUMMARY OF THE INVENTION

The aim of the present invention is to alleviate these problems, by proposing an amplifier circuit with multiple inputs and single output, able to consume a current with a magnitude of substantially less than 2.5 µA.

To this end, the invention proposes a detector amplifier of the type described earlier in which:

each stage is supplied with the same DC current, this making it possible to minimize, on the one hand, the current consumed by the detector amplifier as a function of the characteristics of each of its constituents, and on the other hand, the low-voltage supply voltage as a function of the gain of each amplification stage and of the minimized current, and at least the second stage comprises at least one second input able to receive a second signal to be amplified and/or demodulated.

Thus, an amplifier with multiple inputs and single output is produced, the various stages of which are linked in series to the supply, this making it possible also to fix the value of the DC current which supplies the stages.

According to another characteristic of the invention, each stage includes at least one first circuit capable of amplifying and/or demodulating, and at least one second circuit forming a load impedance for the first circuit to which it is linked, the load impedance being chosen so that the potential difference across the terminals of the second circuit is minimized.

According to yet another characteristic of the invention, in each stage the first circuit comprises a first transistor whose emitter is mounted as common emitter, and the second circuit of the stage comprises at least one second transistor whose collector is linked to the collector or to the emitter of the first transistor of the first circuit.

Thus, according to the desired application, the first transistor will be able to be of NPN or PNP type, depending on whether linked to the collector or to the emitter of the first transistor of the first circuit.

According to yet another characteristic of the invention, the first circuit of each stage furthermore comprises at least one resistor or an equivalent circuit of small capacitance linked between the collector and the base of the first transistor of the first circuit. This makes it possible to maximize the gain of each stage.

Moreover, still according to the invention, certain second circuits furthermore comprise a resistor linked between the base and the collector of the second transistor of the second circuits, and a capacitor linked between the base and the emitter of this same second transistor.

Such a setup makes it possible, on the one hand, to obtain a high load impedance under AC current for the first circuits to which the second circuits are respectively linked, and on the other hand to produce active-filter stages.

Particularly advantageously, the output of the first circuit of a stage is linked to the first circuit of the stage following the stage, by a coupling capacitor.

Thus, a signal amplified and/or demodulated by a stage can be transmitted to the following stage. This makes it possible moreover to produce an active-filter stage. Furthermore, the functions carried out by each stage are properly isolated from one another. The device is not therefore subject to electronic instabilities.

In a preferable embodiment of the invention, the detector amplifier comprises:

a first stage including:
* a first circuit connected to ground and capable of demodulating and amplifying a first signal from a first input linked to the base of a first transistor, and of amplifying a second signal from a second input linked to the emitter of the first transistor, and
* a second circuit linked to the output of the first circuit by the collector of a second transistor, and forming a load impedance for the first circuit, and capable of delivering the first and/or second amplified and/or demodulated signals on the output of the first circuit, which output forms the output of the first stage;

a second stage including:
* a first circuit linked on the one hand to the output of the first stage and on the other hand to the emitter of the second transistor of the second circuit of the first stage, and capable of amplifying on the one hand the first and/or the second signal from the output of the first stage, which output forms the first input of the second stage, and on the other hand a second signal from a second input of said second stage, which inputs are linked to the base of a first transistor; and
* a second circuit linked to the output of the first circuit by the collector of a second transistor, and forming a load impedance for the first circuit;

and capable of delivering the first and/or second signals amplified and/or demodulated by the first and/or second stages, and/or the third signal amplified by the second stage in the area of the output of said first circuit, which output forms the output of the second stage;

a third stage including:
* a first circuit linked on the one hand to the output of the second stage and on the other hand to the emitter of the second transistor of the second circuit of the second stage, and capable of amplifying the first and/or second and/or third signals from the output of the second stage and terminating at the base of a first transistor, and

* a second circuit linked, on the one hand, to the output of the first circuit by the collector of a second transistor, for which first circuit it forms a load impedance, and, on the other hand, to a low-voltage supply capable of delivering a DC current, and capable of delivering on an output the signals from the second stage, after amplification, which output forms the output of the detector amplifier.

Thus, three external signals can be processed by the detector amplifier according to the invention, and then delivered on an output.

In such an embodiment, on the one hand, each transistor operates with an emitter-collector voltage substantially equal to 0.5 volts, and on the other hand, the minimizings of the supply voltage and of the DC current permit a supply voltage substantially equal to 2.7 volts and a DC current during operation of substantially less than or equal to 2.3 µA, for amplification gains substantially greater than 30 dB.

The value of the current consumed corresponds to the limit of the nominal specifications of the components used (for example transistors specified as low current of the BC 549C type), this making it possible for such a detector amplifier to operate with constant characteristics, for at least two years.

BRIEF DESCRIPTION OF THE DRAWINGS

Other characteristics and advantages of the invention will emerge from an examination of the detailed description below, and the appended drawings, in which:

FIG. 1 is a functional diagram of the detector amplifier according to the invention;

FIG. 2 is a diagram illustrating the embodiment of the first AM/FM low frequency amplification/demodulation stage;

FIG. 3 illustrates an example of a current source able to supply stabilized current to the amplification/demodulation circuit of the first stage, or to the amplification circuit of the second stage;

FIG. 4 is a diagram illustrating the construction of the amplification circuit of the second amplification stage;

FIG. 5 is a diagram illustrating the construction of the amplification circuit of the third amplification stage;

DETAILED DESCRIPTION OF THE PREFERRED EMBODIMENTS

Figure 6:
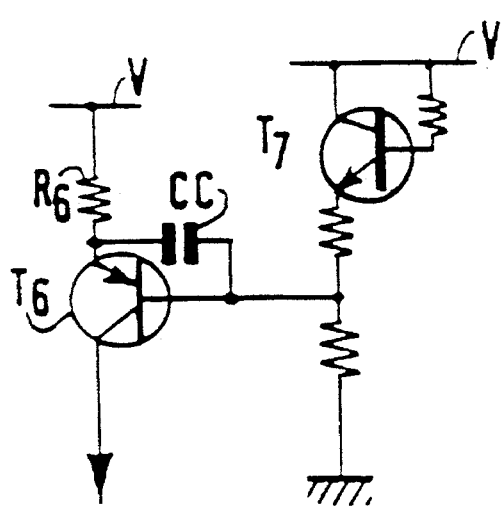
FIG. 6 is a diagram of a constant-current source able to supply the amplification circuit of the third stage.

Reference is made firstly to FIG. 1.

The amplifier-demodulator according to the invention comprises, between ground Gnd and a DC voltage source V, three stages:

a first amplification and demodulation stage comprising components D capable of demodulating a first signal arriving on its first input I1 and a first amp A1 capable of amplifying on the one hand the first signal after demodulation, and on the other hand, a second signal arriving on a second input I2;

a second stage comprising a second amp A2 capable of amplifying a third signal arriving on a third input I3 and/or one at least of the signals from the first stages and a third stage comprising a third amp A3 capable of amplifying at least one of the signals from the first D, A1 and second A2 stages, and whose output O constitutes the output of the detector amplifier.

In such an amplifier, the external signals received do not generally occur simultaneously. However, if such were the case, it would of course be possible to link a discriminator to the output O.

The first stage D, A1 receives, on the one hand, on its first input I1, high-frequency signals HF, amplitude modulated AM or frequency modulated FM, and on the other hand, on its second input I2, low-frequency signals LF. This first input I1 exhibits a high impedance (50 kΩ) and the second input (I2) exhibits a very high input impedance (1 MΩ).

The second stage A2 receives, for example, on the third input I3, pulses from an infrared sensor whose capacitive output impedance is equal to around 1000 pF.

The third stage A3 is a low-frequency LF amplification stage with low input impedance.

Each stage can be connected in series to the battery V, across one or more other stages, the biasing of the various stages results either from the presence of a link resistor whose consumption is proportional to the square of the magnitude of the current (however, the magnitude is low), or from the presence of a current source denoted CS in what follows, and which itself comprises at least one transistor T which has the advantage of delivering a stable current, as will be explained below.

Whereas in the prior art, each function consumed its own current, the supply currents differing depending on the stage, in the amplifier according to the invention, all the stages D, A1–A3 are, from the supply current standpoint, strictly in series and consequently traversed by the same DC supply current which, for a voltage V greater than or equal to 2.7 volts, has a magnitude of less than or equal to 2 μA.

Reference will now be made to FIGS. 2 to 6 to describe in detail the various stages.

FIG. 2 is a diagram illustrating a possible embodiment of the first stage.

The first stage D, A1 comprises a first amplification and demodulation circuit composed of the elements C1, C2, R, T1 and Ze, and of a second circuit CS1 delivering a stabilized current to the first circuit. Such a second circuit CS1 is illustrated in FIG. 3.

In what follows, the elements C are capacitors, the elements R are resistors, the elements T are transistors, and the elements Z are capacitive or resistive impedances.

In the first circuit, R connects the base of transistor T1 to its collector, this making it possible to produce the amplification function.

The emitter of T1 is coupled to the ground of the circuit by Ze. T1 is therefore common-emitter mounted.

The signals processed by this first circuit are delivered in the area of output O1.

The first stage is linked to the second stage by C3, whereas C4 couples the input I3 to the second stage A2 (FIG. 4).

With the current traversing the transistor T1 being very small, typically 2 μA, the transistor T1 operates in the non-linear region of its characteristic.

For the high frequencies HF, (F>60 kHz), the current source CS1, equivalent capacitances C3, C4 pair constitutes an integrator circuit affording a demodulation function both in terms of amplitude and frequency, the current absorbed being, for the positive half-cycles of the signal, greater than that provided by the AC current source CS1. The input impedance in the area of I1 remains fairly high (~50 kΩ) bearing in mind the small current traversing T1, and this even when the emitter is connected directly to zero volts (Ze=0).

For the low frequencies LF (F<5 kHz), the capacitance C3, C4 represents a high impedance value. Thus, T1 operates solely in the amplification regime since CS1 determines its impedance. C3 and C4 behave like a capacitive divider bridge in respect of the output signal O1 from the first stage, this not being overly penalizing since the gain of this stage is high.

The input impedance of T1 is very high (>1 MΩ), in respect of the LF signals, and C1 (around 1000 pF) will be suitable as a low-frequency link capacitor (f>500 Hz) if it is wished to use the input I1.

The input I2 uses the coupling with the emitter of T1. A coil-containing sensor can be inserted directly into the emitter, given the low current traversing T1.

By way of example, represented in FIG. 3 is a suitable solution for producing the current source CS1 forming a high load impedance for the first circuit. The transistor T2 is a transistor of NPN type. The capacitor C maintains the base-emitter voltage constant within the frequency band used. Voltage at the terminals of T2 is constant and limited to around 475 mV, so that the DC voltage drop across its terminals is very small compared to that which would be obtained with a straightforward resistor of the same impedance.

In FIG. 4 is illustrated the second amplification stage A2 for the signals from the input I3 and from the first stage D, A1.

The signals processed by this second stage A2 are delivered in the area of output O2.

As with the first stage, again there are a first circuit carrying out amplification, composed of R and T3, and a second circuit Z2 delivering a stabilized current to said first circuit and forming a load impedance for this first circuit. This second circuit is identical to that CS1 of the first stage described earlier and illustrated in FIG. 3.

The emitter of the transistor T3 of the first circuit is in the image of transistor T1 of the first circuit of the first stage coupled to ground via the capacitor CD3. T3 is therefore likewise common-emitter mounted. The input impedance of T3, working under LF (F<5 kHz), is very high, with a current almost equal to 2 μA.

The generator G2 linked to the input I3 consists of the reversed junction of an infrared photodiode. G2 exhibits a sufficiently high capacitance relative to C3, C4 for the first stage D, A1 to operate correctly in demodulation. C4 represents, with respect of G2, the coupling capacitance with the second stage A2. This coupling occurs under good conditions since the impedance seen from the generator G2 side is very high.

In FIG. 5 is illustrated the third amplification stage A3 for the signals from the first and second stages. This stage operates under low frequency LF, and likewise comprises a first and a second circuit.

The signals processed by this third stage are delivered in the area of output O.

The first circuit forming the amplification circuit of the third stage A3 is identical to the first circuit of the second stage A2. Again there is the transistor T5 common-emitter mounted. CC is the coupling capacitor which ensures transmission of the signals from the preceding stages to the area of the third stage.

With T5 working under LF (F<5 kHz), its input impedance is high.

The second circuit is represented by Z3. It produces the high load impedance of the first circuit, and can consist of a resistor of a few hundred kΩ if the supply voltage V is continuous and stable, or a current source such as that which was represented in FIG. 3. In this case, the magnitude i is defined by the value of R provided that V is sufficiently high (3 volts for example).

However, when these conditions are not fulfilled, a current source CS3 is required. An example embodiment of such a source is illustrated in FIG. 6.

The transistors T6 and T7 fix the value of the magnitude of the current supplying the whole of the circuit and do so irrespective of the value of the voltage V, provided, of course, that V is greater than or equal to the operating value namely around 2.7 volts. The advantage of this solution is that the current source T6 operates with a very low breakdown voltage, this making it possible for the circuit to operate with a supply voltage as small as 2.7 volts.

Figure 7:
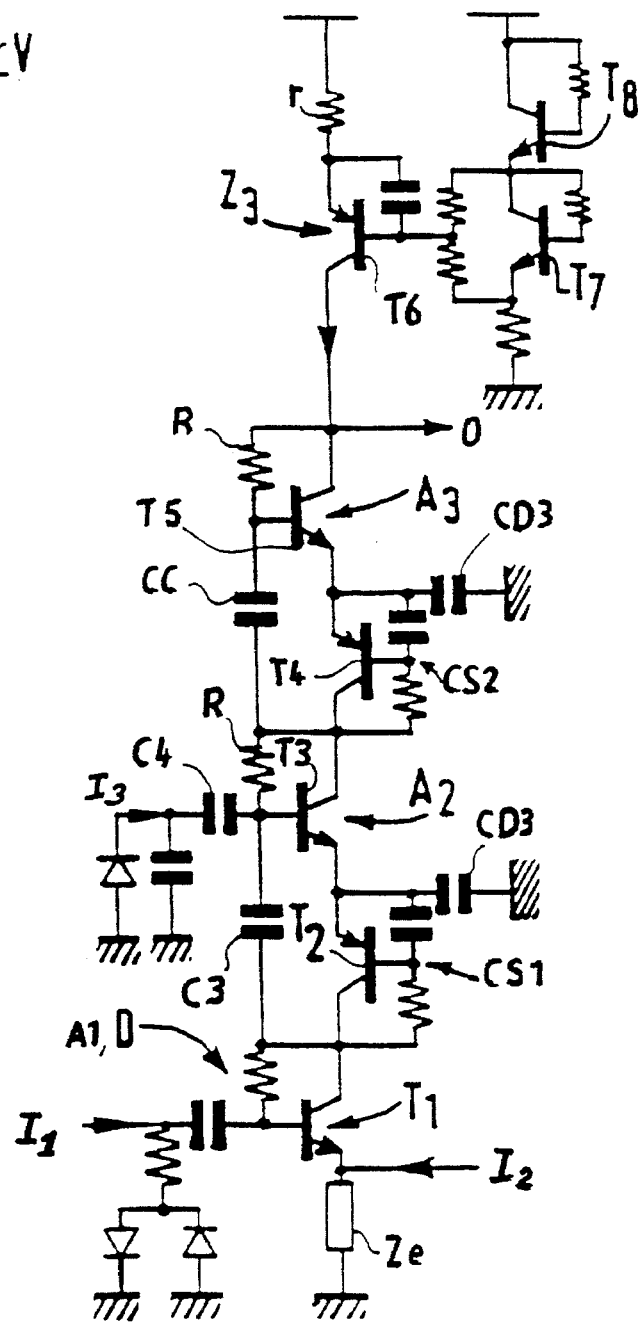
FIG. 7 is a diagram of a demodulator amplifier according to the invention combining the circuits illustrated in FIGS. 2 to 6.

In FIG. 7 are again found the various elements which have just been described separately, with a few minor improvements such as the input I1 of the first stage which is coupled to ground by a resistor and a set of diodes, and the second circuit of the third stage producing CS3 to which has been added a transistor T8 and a few resistors so as to enhance the stability of the current delivered by the third stage.

In this detector amplifier, all the transistors operate with a minimal emitter-collector voltage of around 0.5 volts, this making it possible to minimize the consumption since the base-collector bias resistor is the cause of a very small voltage drop, this making it possible to minimize the operating voltage.

Moreover, the fact that the first amplification and/or demodulation circuits comprise a transistor whose collector is coupled to a high load impedance under AC, and a resistor which couples the base of the transistor and its collector, permits optimization of the gain of each stage. Thus, depending on the characteristics of the components used, the amplification gains of a stage may reach 50 dB.

Finally, in such an amplifier the various stages are coupled in series by coupling capacitors C3 and CC. This makes it possible, on the one hand, to ensure transmission of a signal processed by a stage n to the following stage n+1, and on the other hand to isolate the stages from one another so as not to disturb their respective functions.

The noteworthy performance of such an amplifier enables it to operate autonomously with constant characteristics for durations of much greater than two years, by using a 2.7 volts DC battery.

The present invention can be applied in all autonomous-supply electronic devices, generally a battery, the use of which implies that they remain permanently on standby, in general for large periods of time (often greater than a year) and which, during these standby periods must be able to be activated by one or more electronic signals whose origin is external to the amplifier.

Thus, the invention applies, for example, to antitheft devices for automobiles, to toll-type transactional devices, or again to devices for access control.

It goes without saying that numerous variants may be derived, especially by substituting equivalent technical means, without thereby departing from the scope of the invention.

We claim:

1. A detector amplifier comprising:

a first stage having a first input for receiving a first input signal, and an output for outputting a first output signal, the first stage amplifying and/or demodulating the first input signal to form the first output signal;

at least one second stage coupled in series to the first stage, the second stage having a first input for receiving the first output signal from the first stage, at least one second input for receiving a second input signal, and an output for outputting a second output signal, the second stage amplifying and/or demodulating the first output signal and the at least one second input signal to form the second output signal; and a low-voltage supply coupled in series with the first and the at least one second stage, the low-voltage supply having a supply voltage and supplying a current to the stages, the supply voltage being minimized as a function of a gain of each of the first stage and the at least one second stage, and the current supplied by the low-voltage supply being minimized as a function of characteristics of constituent components of each first stage and the at least one second stage.

2. A detector amplifier as claimed in claim 1, wherein each stage includes:

at least one first circuit for amplifying and/or demodulating an input signal, and at least one second circuit forming a load impedance coupled to the first circuit so that a potential difference across the second circuit is minimized.

3. The detector amplifier as claimed in claim 2, wherein the first circuit of each stage further includes a first transistor having a base and a collector, at least one resistor coupled between the collector and the base of the first transistor, and the first transistor being configured in a common emitter configuration;

wherein the second circuit further includes a second transistor having a base, a collector and an emitter, a resistor coupled between the base and the collector of the second transistor, and a capacitor coupled between the base and the emitter of the second transistor;

wherein the second transistor is coupled to a first transistor of a first circuit of a subsequent stage; and wherein the first circuit has a high load impedance under AC current and a high-gain amplification of the first and second input signals, and the first circuit forms an active filter stage with the second circuit.

4. The detector amplifier as claimed in claim 2, wherein the first circuit of each stage includes a first transistor having a base and a collector, and a first capacitor coupled between the collector and the base of the first transistor, and the first transistor being configured in a common emitter configuration;

wherein the second circuit further includes a second transistor having a base, a collector and an emitter, a resistor coupled between the base and the collector of the second transistor, and a second capacitor coupled between the base and the emitter of the second transistor:

wherein the second transistor is coupled to a first transistor of a first circuit of a subsequent stage; and wherein the first circuit has a high load impedance under AC current and a high-gain amplification of the first and second input signals, and the first circuit forms an active filter stage with the second circuit.

5. The detector amplifier as claimed in claim 2, wherein an output of the first circuit of a first stage is coupled to an input of the first circuit of a second stage which is subsequent to the first stage by a coupling capacitor.

6. The detector amplifier as claimed in claim 2, wherein the second circuit of the first stage includes a first transistor having an emitter, and the first circuit of the second stage includes a second transistor having an emitter, and wherein the emitter of the second transistor is coupled to the emitter of the first transistor.

7. The detector amplifier as claimed in claim 1, wherein the first stage includes:

a first circuit having a first input, a second input and an output, the output of the first circuit being an output of the first stage, the first circuit including a first transistor having a base coupled to the first input and an emitter coupled to the second input, the first circuit demodulating and amplifying a first input signal coupled to the first input of the first circuit and amplifying a second input signal coupled to the second input of the first circuit to form a first output signal, and a second circuit having a second transistor, the second transistor having a collector and an emitter, the second circuit being coupled to the output of the first circuit by the collector of the second transistor, the second circuit forming a load impedance for the first circuit; and the at least one second stage includes:

a second stage including:

a third circuit having a first input, a second input and an output, the output of the third circuit being an output of the second stage, the first input of the third circuit being coupled to the output of the first stage, the third circuit including a third transistor having a base and an emitter, the base of the third transistor being coupled to the second input of the third circuit for receiving a third input signal and the emitter of the third transistor being coupled to the emitter of the second transistor of the second circuit of the first stage, the third circuit amplifying the third input signal and the first output signal and outputting a second output signal, and a fourth circuit having a fourth transistor, the fourth transistor having a collector, the fourth circuit being coupled to the output of the third circuit by the collector of the fourth transistor, and the fourth circuit forming a load impedance for the third circuit; and a third stage including:

a fifth circuit having an input and an output, the output of the fifth circuit forming an output of the detector, the input of the fifth circuit being coupled to the output of the second stage, the fifth circuit including a fifth transistor having a base and an emitter, the emitter of the fifth transistor being coupled to the emitter of the fourth transistor, the fifth circuit amplifying the first and/or second and/or third signals from the output of the second stage; and a sixth circuit including a sixth transistor having a collector, the sixth circuit being coupled to the output of the fifth circuit by the collector of the sixth transistor, the sixth circuit forming a load impedance for the fifth circuit and being coupled to the low-voltage supply for receiving the current.

8. The detector amplifier as claimed in claim 7, wherein the sixth circuit further comprises a seventh transistor having a collector and an emitter, the collector and emitter of the seventh transistor being coupled to the sixth transistor via a plurality of resistors, and an eighth transistor having an emitter and a collector, the emitter of the eight transistor being coupled to the collector of the seventh transistor and the collector of the eighth transistor being coupled to the low-voltage supply;

wherein a value of the current supplied to the first, second and third stages is fixed.

9. The detector amplifier as claimed in claim 8, wherein each transistor operates with an emitter-collector voltage substantially equal to 0.5 volts.

10. The detector amplifier as claimed in claim 9, wherein a voltage of the supply voltage substantially equals 2.7 volts and the current supplied to the first, second and third stages during operation is less than or equal to 2.3 µA for amplification gains of the detector substantially greater than 30 dB.

* * * * *